(12) United States Patent
Yao et al.

(10) Patent No.: US 8,091,001 B2
(45) Date of Patent: Jan. 3, 2012

(54) FPGA PROGRAMMING STRUCTURE FOR ATPG TEST COVERAGE

(75) Inventors: Stephen U. Yao, Markham (CA);
Darwin D. Q. Samson, Markham (CA);
Ket-Chong Yap, San Ramon, CA (US)

(73) Assignee: QuickLogic Corporation, Sunnyvale, CA (US)

( * ) Notice: Subject to any disclaimer, the term of this patent is extended or adjusted under 35 U.S.C. 154(b) by 404 days.

(21) Appl. No.: 11/565,441

(22) Filed: Nov. 30, 2006

(65) Prior Publication Data

US 2008/0133988 A1 Jun. 5, 2008

(51) Int. Cl.
*G01R 31/28* (2006.01)

(52) U.S. Cl. ......... 714/725; 714/716; 714/732; 714/733

(58) Field of Classification Search .................. 714/724, 714/725, 726, 727, 730, 733, 734
See application file for complete search history.

(56) References Cited

U.S. PATENT DOCUMENTS

| | | | |
|---|---|---|---|
| 4,847,612 A * | 7/1989 | Kaplinsky | 326/10 |
| 5,418,790 A * | 5/1995 | Kim | 714/718 |
| 5,424,655 A | 6/1995 | Chua | |
| 5,654,649 A | 8/1997 | Chua | |
| 5,825,201 A | 10/1998 | Kolze | |
| 5,859,543 A | 1/1999 | Kolze | |
| 5,898,776 A * | 4/1999 | Apland et al. | 326/8 |
| 5,969,538 A * | 10/1999 | Whetsel | 324/763 |
| 6,081,129 A * | 6/2000 | Apland et al. | 326/41 |
| 6,148,390 A * | 11/2000 | MacArthur et al. | 712/37 |
| 6,426,649 B1 * | 7/2002 | Fu et al. | 326/41 |
| 6,552,410 B1 | 4/2003 | Eaton et al. | |
| 7,187,199 B1 * | 3/2007 | Lai | 326/38 |

* cited by examiner

*Primary Examiner* — Jeffrey A Gaffin
*Assistant Examiner* — Daniel McMahon
(74) *Attorney, Agent, or Firm* — Silicon Valley Patent Group LLP

(57) ABSTRACT

Testing of combinatorial logic in a programmable device is provided by routing input and/or output test values as signals from and back to dedicated logic through programming circuitry in programmable logic. Some embodiments of the present invention provide for a method for testing functional logic block of an application-specific standard product (ASSP) in a programmable logic device, the method comprising: storing an input value into a register; passing the input value from the register to combinatorial logic; producing an output value from the combinatorial logic; passing the output value from the combinatorial logic to the register; saving the output value in the register; and reading the output value out of the register.

25 Claims, 9 Drawing Sheets ial logic within each functional logic block. Therefore, it is desirable to provide testing structures and methods to effectively test combinatorial circuitry in a functional logic block prior to permanent programming of antifuses by an end-user.

FPGA PROGRAMMING STRUCTURE FOR ATPG TEST COVERAGE

CROSS-REFERENCE TO RELATED APPLICATIONS

Not applicable.

BACKGROUND OF THE INVENTION

1. Field of the Invention

The invention relates to programmable devices and in particular to testing of combinatorial logic in a functional logic block, for example, in an unprogrammed field-programmable gate array (FPGA) or in an unprogrammed programmable application specific integrated circuit (pASIC).

2. Background of the Invention

A programmable device is a versatile integrated circuit chip, the internal circuitry of which may be configured by an individual user to realize a user-specific circuit. A programmable device includes configurable logic sometimes referred to as a field-programmable gate array (FPGA), a programmable application specific integrated circuit (pASIC), a logic cell array (LCA), a programmable logic device (PLD), and a complex programmable logic device (CPLD). To configure a programmable device, the user configures an on-chip interconnect structure of the programmable device so that selected input ports and selected output ports of selected on-chip circuit components are electrically connected together in such a way that the resulting circuit is the user-specific circuit desired by the user.

In a programmable device employing, for example, amorphous silicon antifuses, selected amorphous silicon antifuses disposed between selected wire segments are "programmed" to electrically connect together the selected wire segments. Which antifuses are programmed and which antifuses are left unprogrammed determines how the circuit components are interconnected and therefore determines the resulting functionality of the circuit. For background information on programmable devices employing antifuses, see, e.g.: U.S. Pat. No. 5,424,655 entitled "Programmable application specific integrated circuit employing antifuses and methods therefor"; U.S. Pat. No. 5,825,201 entitled "Programming architecture for a programmable integrated circuit employing antifuses"; and U.S. Pat. No. 6,426,649 entitled "Architecture for field programmable gate array." The contents of these documents are incorporated herein by reference in their entirety.

The semiconductor industry is driven with a desire to provide higher levels of integration. With higher levels of integration, silicon space and cost are reduced while performance and reliability are increased. Unfortunately, higher levels of integration lead to greater specificity. For example, application specific integrated circuits (ASICs) are highly specific devices that often serve the needs of only one customer. Programmable logic devices, such as field programmable gate arrays (FPGAs) are versatile integrated circuit chips, which have internal circuitry logic with user selected connections that a user can configure to realize user-specific functions. While programmable logic is versatile, there are significant design challenges in size, routing, pin-out stability when mapping large complex functions onto a silicon platform containing programmable logic.

A programmable device may include a plurality of functional logic blocks having combinatorial logic which a user uses as fundamental building blocks to realize a desired circuit. Consequently, what is needed is a single integrated device that combines the flexibility of programmable logic with the performance and reliability of a dedicated device but also allows for more complete testing of combinatorial logic within each functional logic block. Therefore, it is desirable to provide testing structures and methods to effectively test combinatorial circuitry in a functional logic block prior to permanent programming of antifuses by an end-user.

SUMMARY

Testing of combinatorial logic in a programmable device is provided by routing input and/or output test values as signals from and back to dedicated logic through programming circuitry in programmable logic.

Some embodiments of the present invention provide for a method for testing functional logic block of an application-specific standard product (ASSP) in a programmable logic device, the method comprising: storing an input value into a register; passing the input value from the register to combinatorial logic; producing an output value from the combinatorial logic; passing the output value from the combinatorial logic to the register; saving the output value in the register; and reading the output value out of the register.

Some embodiments of the present invention provide for a method for testing functional logic block of an application-specific standard product (ASSP) in a programmable logic device, the method comprising: storing an input value into a first register; passing the input value from the first register to combinatorial logic in a first functional logic block; producing an output value from the combinatorial logic; routing the output value from the combinatorial logic through a switch array to a second register outside the first functional logic block and in a separate functional logic block from the first register; saving the output value in the second register; and reading the output value out of the second register.

Some embodiments of the present invention provide for a method for testing functional logic block of an application-specific standard product (ASSP) in a programmable logic device, the method comprising: storing an input value into a first register outside a first functional logic block; routing the input value from the first register through a switch array to combinatorial logic within the first functional logic block; producing an output value from the combinatorial logic; passing the output value from the combinatorial logic to a second register; saving the output value in the second register; and reading the output value out of the second register.

Some embodiments of the present invention provide for a system for testing functional logic block of an application-specific standard product (ASSP) in a programmable logic device, the system comprising: a switch array comprising a plurality of columns and a plurality of rows and a plurality of switches each having a first port coupled to a respective column of the plurality of columns and a second port coupled to a respective row of the plurality of rows; a first plurality of gates each having a first port coupled to a corresponding one of the plurality of columns, a second port coupled to a source of a first programming potential, and a control port; a second plurality of gates each having a first port coupled to a corresponding one of the plurality of rows, a second port coupled to a source of a second programming potential, and a control port; a plurality of functional logic blocks each comprising combinatorial logic; a first register; gate control logic coupled to each of the control ports of each of the first plurality of gates and each of the second plurality of gates, wherein the gate control logic is operable to route a signal between the switch array; and at least one of the first register and one of the plurality of functional logic blocks. These and other aspects, features and advantages of the invention will be apparent from reference to the embodiments described hereinafter.

BRIEF DESCRIPTION OF THE DRAWINGS

Embodiments of the invention will be described, by way of example only, with reference to the drawings.

DETAILED DESCRIPTION OF THE INVENTION

Figure 1:
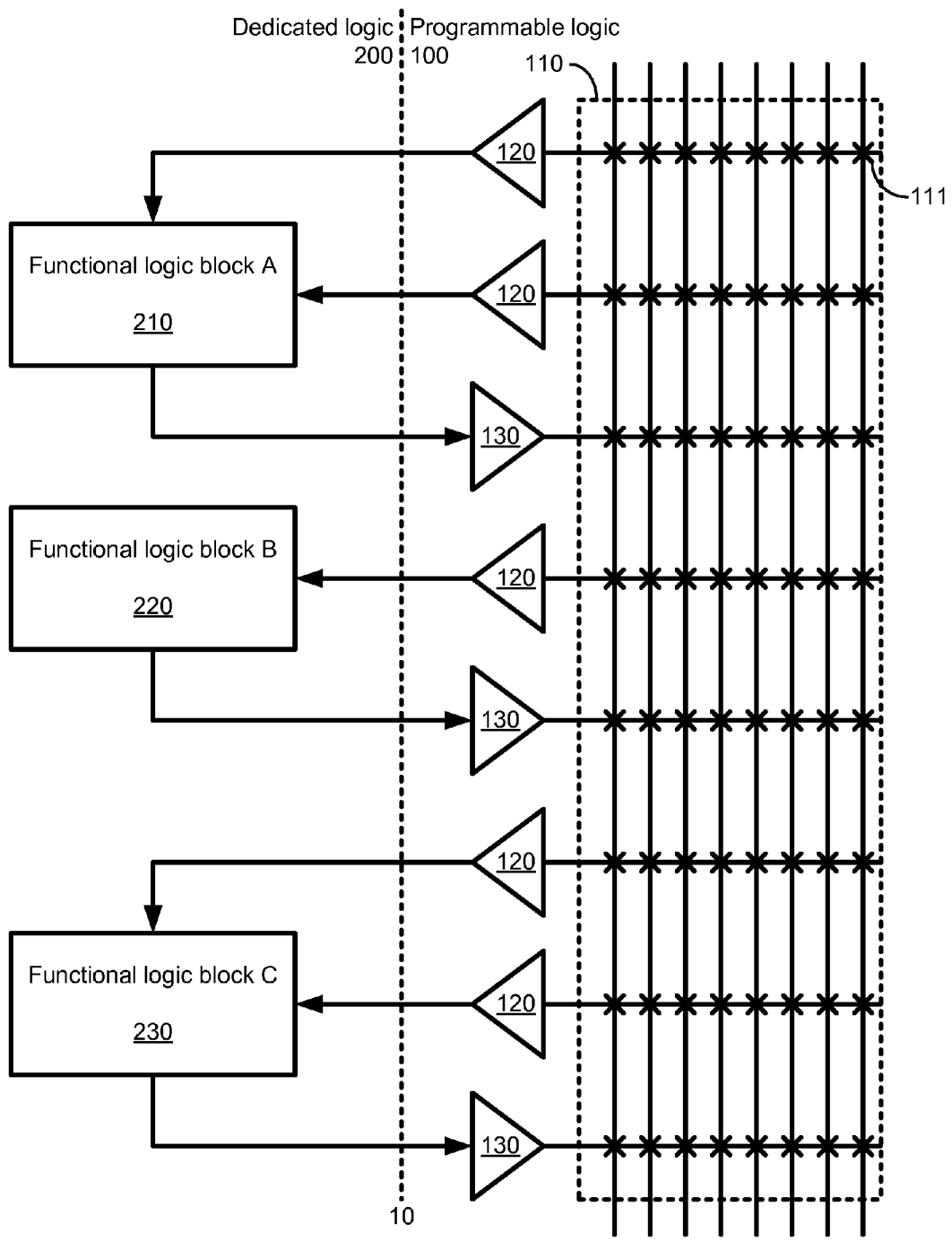
FIG. 1 illustrates circuitry in an integrated circuit including dedicated logic and programmable logic.

In the following description, reference is made to the accompanying drawings, which illustrate several embodiments of the present invention. It is understood that other embodiments may be utilized and mechanical, compositional, structural, electrical, and operational changes may be made without departing from the spirit and scope of the present disclosure. The following detailed description is not to be taken in a limiting sense. Furthermore, some portions of the detailed description that follows are presented in terms of procedures, steps, logic blocks, processing, and other symbolic representations of operations on data bits or values that can be performed in electronic circuitry. A procedure, computer executed step, logic block, process, etc., are here conceived to be a self-consistent sequence of steps or instructions leading to a desired result. The steps are those utilizing physical manipulations of physical quantities. Each step may be performed in hardware, software, firmware, or combinations thereof.

Manufacturers of programmable devices, such as FPGAs, pASICs, LCAs, PLDs, and CPLDs, desire to have full test coverage over combinatorial logic within such programmable devices. By more fully testing programmable devices before shipment to and programming by customers, a manufacturer may lower the number of components shipped with faulty functional logic, reduce customers' efforts and costs in debugging programmed components, and reduce a manufacturer's costs of handling devices returned by customers.

A manufacturer may test functional logic blocks having a register at each input port and at each output port by automatic test pattern generation (ATPG), which provides for test coverage and pinpoint testability of these functional logic blocks. However, not all functional logic blocks may contain a register at each input port and at each output port. For example, a programmable device may have 95% of its functional logic blocks containing a register at each input port and at each output port of its combinatorial logic and 5% of its functional logic blocks missing at least one register connected to an input or output port of a functional logic block's combinatorial logic. Conventionally, in this example, 95% of the functional logic blocks would be tested and 5% would be untested. That is, functional logic blocks having one or more un-registered input or output ports are left untested. An "un-registered" port refers to a port at the edge of a functional logic block that is connected to combinatorial logic in a functional block without an intervening register between the port and the combinatorial logic. Such ports with and without registers are described further below with reference to FIGS. 4A through 10B.

One solution to provide complete test coverage would be to redesign the functional logic blocks to include the missing registers. Adding such registers, however, may require valuable silicon real estate requiring chip size to increase and/or other functionality to be sacrificed. Another solution in accordance with embodiments of the present invention and as described in detail below, is to use re-use an existing register in place of the missing register. By aptly routing signals between combinatorial logic and programmable logic to find and re-use the existing register, the issue of an un-registered input or output port of a functional logic block may be alleviated.

FIG. 1 illustrates circuitry in an integrated circuit 10 including dedicated logic 200 and programmable logic 100. Dedicated logic 200 is sometimes referred to as an application-specific standard product (ASSP) and programmable logic 100 is sometimes referred to as a fabric. Programmable logic 100 and dedicated logic 200 each may have I/O pins for connection to external circuitry (not shown). Interface circuits 120 and 130 electrically connect programmable logic 100 to dedicated logic 200.

Integrated circuit 10 may be thought of as a programmable logic device with dedicated logic 200 embedded onto the same piece of silicon, or vice versa, i.e., a dedicated device with embedded programmable logic 100. Programmable logic 100 is, for example, a field programmable gate array (FPGA) or other circuitry having user programmable circuit connections, while dedicated logic 200 is a fixed circuit implementing a desired function. For example, dedicated logic 200 may be an application specific circuit that performs a function such as creating an interface with an industry standard bus.

Programmable logic 100 includes a switch fabric 110, output drivers 120 and input drivers 130. Switch fabric 110, also called a switch array or an array of switches, includes columns and rows of switches 111 logically positioned at respective intersections of the column wire segments and row wire segments. Each column and each row individually represents an isolated conductor when the switches are unprogrammed. Each switch 111 has a first port coupled to a respective column and a second port coupled to a row. When unprogrammed, a switch 111 provides a high resistive barrier between the respective row and the respective column wire segments. When programmed, however, a switch 111 provides a low resistance path between the respective column and the respective row wire segments.

The conducting state of each individual switch 111 may be independently programmed to conduct or may be left unprogrammed in a non-conducting state. Drivers 120 provide an output signal from switch fabric 110 of programmable logic 100 as an input signal to one or more input ports if functional logic blocks of dedicated logic 200. Drivers 130 each receive an output signal from an output port of a functional logic block of dedicated logic 200. Drivers 130 provide this signal as an input signal to switch fabric 110 of programmable logic 100. By programming a set of switches 111 to conduct, switch fabric 110 and drivers 120 and 130 may route signals from various output ports of a particular functional logic block to input ports of that or other functional logic blocks.

Dedicated logic 200 may include distinct functional logic blocks. Each functional logic block may have one or more input signals routed to it by the programmable logic 100 and also one or more outputs routed from it by programmable logic 100, as described above. As shown, dedicated logic 200 includes functional logic block A 210, functional logic block B 220, and functional logic block C 230. Functional logic block A 210 and functional logic block C 230 each include two input ports supplied by separate drivers 120 and a distinct output port coupled to driver 130. Similarly, functional logic block B 220 includes an input port supplied by a driver 120 and an output port coupled to a driver 130. Functional logic blocks 210, 220 and 230 each include combinatorial logic 224, as described below with reference to FIG. 4A.

For additional information on programmable logic modules including dedicated logic and programmable logic, see, e.g., U.S. Pat. No. 6,552,410 to Eaton et al., titled "Programmable antifuse interfacing a programmable logic and a dedicated device", dated Apr. 22, 2003 and assigned to QuickLogic Corporation, the contents of which are incorporated by reference in its entirety herein.

Figure 2A:
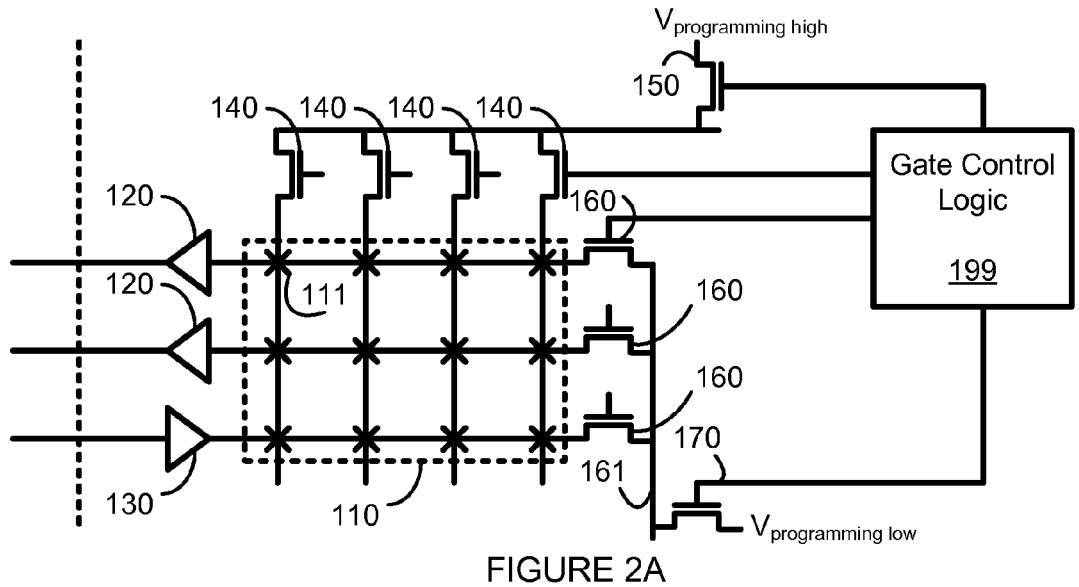
FIGS. 2A and 2B show a schematic view of circuitry used for programming an array of switches in programmable logic.
Figure 2B:
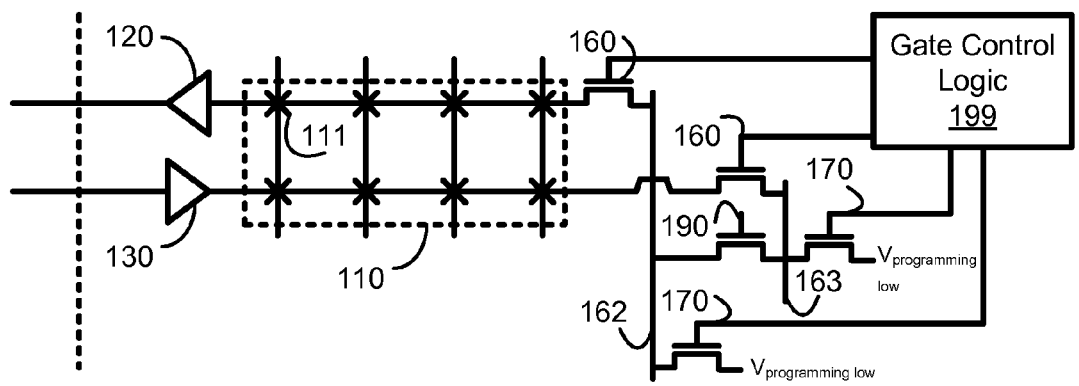

FIGS. 2A and 2B show a schematic view of circuitry used for programming an array of switches in switch fabric 110 in programmable logic.

In FIG. 2A, the programming circuitry includes a first set of gates 140 each having a first port coupled to a corresponding column of switch fabric 110, a second port coupled to a source of a first programming potential (e.g., via gate 150), and a control port for engaging the switch. The programming circuitry also includes a second set of gates 160 each having a first port coupled to a corresponding row, a second port coupled to a source of a second programming potential (e.g., via gate 170), and a control port for engaging the switch. The first programming potential may be a high potential between 6.5 and 12 volts, such as 10.5 volts, and the second programming potential may be a low potential, such as a reference of 0 volts. Particular programming potentials may depend of device geometries and design.

In addition, the programming circuitry includes gate control logic 199, which may include combinatorial logic, a microcontroller, a microcomputer, and/or registers. Gate control logic 199 is coupled to each of the control ports of each of the first set of gates 140 and each of the second set of gates 160 as well as to sources of programming voltages via gates 150 and 170. During programming, gate control logic 199 orchestrates the opening and closing of gates 140, 150, 160 and 170 to force a programming potential across a particular amorphous silicon antifuse selected to be programmed. In programming, the selected amorphous silicon antifuse injects a conductive material into the amorphous silicon to provide a low resistance path between selected column and row wire segments thereby electrically connect together the selected wire segments.

For additional information on circuitry used for programming and antifuse structures, see, e.g., U.S. Pat. No. 5,654,649 to Chua, titled "Programmable application specific integrated circuit employing antifuses and methods therefor", dated Aug. 5, 1997 and assigned to QuickLogic Corporation, the contents of which are incorporated by reference in its entirety herein.

According to embodiments of the present invention, gate control logic 199 is used during device testing of an unprogrammed switch fabric 110 to enable programming gates 160 thereby routing a signal from a driver 130 to a driver 120. Specifically, gate control logic 199 turns on sets of programming gates 160 to route signals from dedicated logic 200 back to dedicated logic 200. As illustrated, a signal from driver 130 is connected to a third row of switch fabric 110. The third row is also connected to a first port of programming gate 160. When programming gate 160 is turned on, a signal from driver 130 is carried to conductor 161. Gate control logic 199 also turns on programming gate 160 connected to the second row. In doing so, the signal now on conductor 161 is carried to an input port of driver 120. Thus, by enabling two programming gates, gate control logic 199 routed a signal from driver 120 to driver 130. Applications of this routing are described further below.

FIG. 2B illustrates an alternative arrangement where respective programming gates 160 have a second port connected to different conductors. Unlike the single common conductor 161 connecting the second ports of gates 160 in FIG. 2A, more that one conductor is used in FIG. 2B. As shown, some gates 160 are connected to conductor 162 while other gates 160 are connected to conductor 163. A first gate 160 has a first port connected to a first row of switch fabric 110 and a second port connected to a first conductor 162. A second gate 160 has a first port connected to a second row of switch fabric 110 and a second port connected to a different second conductor 163. To route a signal from driver 130 to driver 120 through switch fabric 110 and gates 160, an additional gate 190 is needed to connect conductors 162 and 163. Gates 140, 150, 160, 170 and 190 may be switches or the like such as a transistor gate, for example a transistor gate having a source, a drain and a gate ports where the gate port acts as a control port provide either a low or high resistive path between the source and drain.

Figure 3:
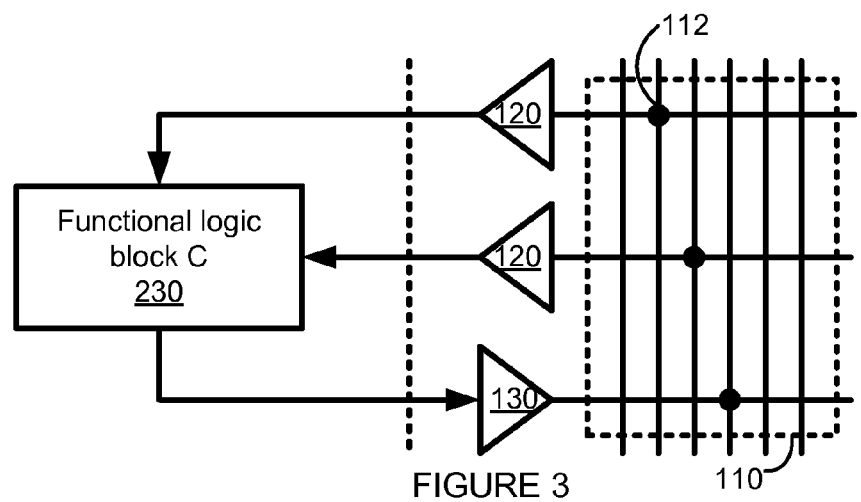
FIG. 3 illustrates routing of input and output signals to a functional logic block with programmed switches.

FIG. 3 illustrates routing of input and output signals to a functional logic block 230 with programmed switches 112. As indicated with a solid circle, a switch 112 is programmed to conduct between a column wire and a first row wire. As shown, three switches are programmed to provide a low resistance conductive path between: (1) a second column wire and a first row wire; (2) a third column wire and a second row wire; and (3) a fourth column wire and a third row wire. Other switches shown at other intersections of rows and columns are left unprogrammed and therefore designed to be non-conducting.

After the switch fabric 110 of programmable logic 100 in integrated circuit 10 is programmed, a driver 120 may be driven by a signal provided by a column wire. For example, a signal on the second column wire will be routed to driver 120 on the first row wire. In this case where a column drives a row, a programming gate 160 (of FIG. 2A) on that row should not also be enabled, which would drive two signals to driver 120. To prevent such driving of two signals on the same conductor, the method of the present invention may be performed on an unprogrammed device.

Figure 4A:
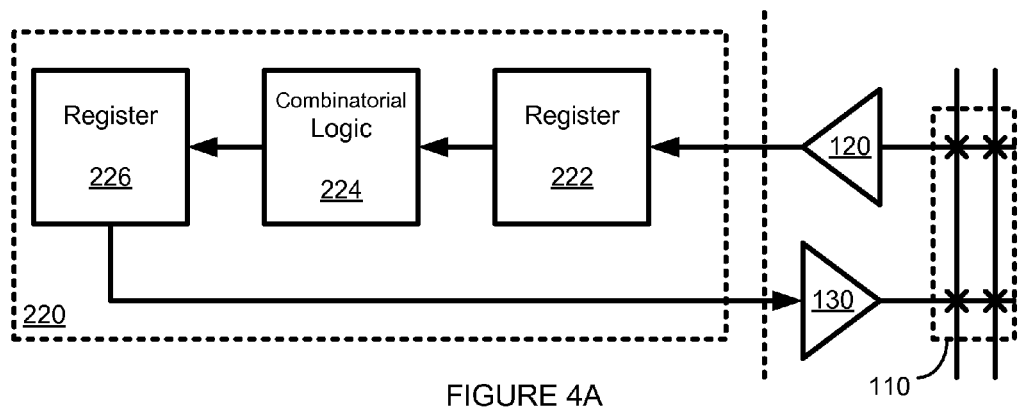
FIGS. 4A and 4B provide examples of a functional logic block having input and output registers for each input and output port.
Figure 4B:
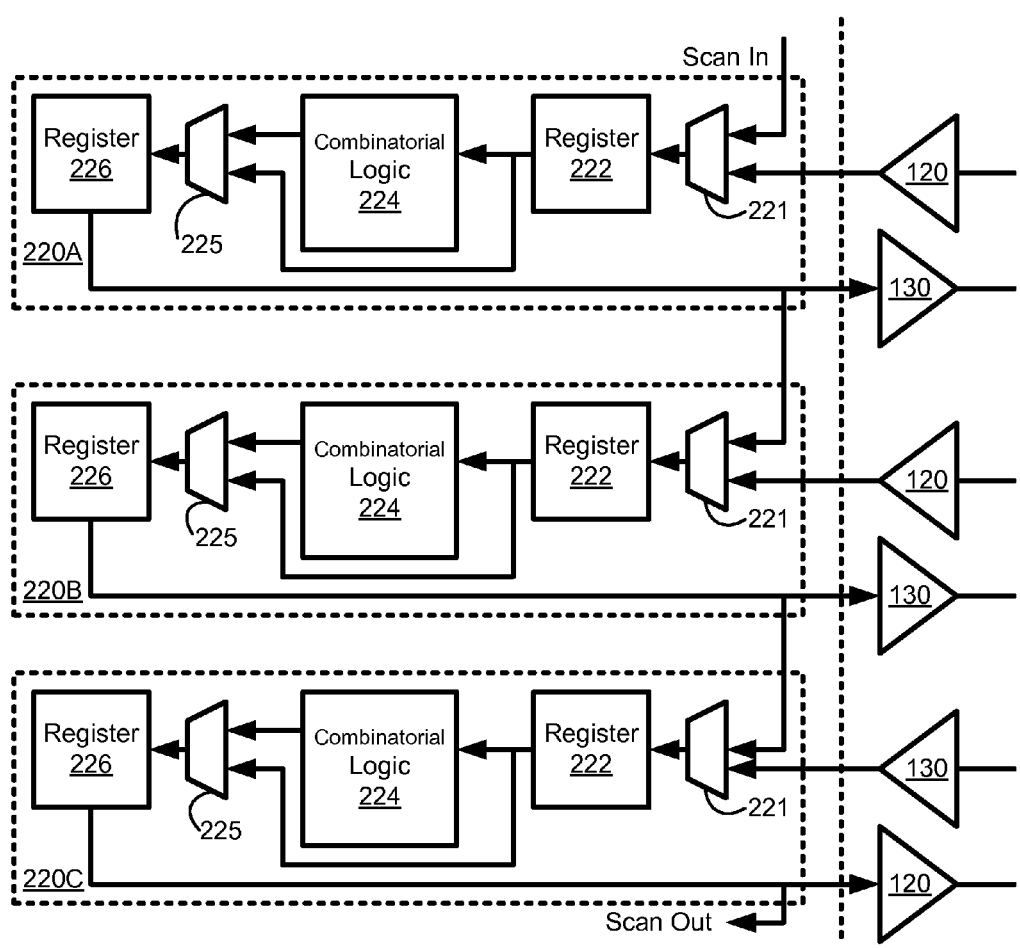

FIGS. 4A and 4B provide examples of a functional logic block 220 having input and output registers 222 and 226 for each input and output ports. The functional logic blocks 220 are each illustrated with combinatorial logic 224 having a single input port and a single output port for simplicity. A more general example of combinatorial logic 224 has one or more input ports with each input port associated with a distinct register 222 for holding an input value and would also have one or more output ports with each output port associated with a distinct register 226 for holding an output value. A value may sometimes be referred to as a signal, a data signal, a logical signal, a bit, a data bit, a voltage, a voltage level, a potential difference, a current level, and the like.

FIG. 4A shows a single functional logic block 220 including a first register 222, combinatorial logic 224 and a second register 226. During testing, first register 222 is loaded with an input test value for testing combinatorial logic 224. The test signal may be loaded through a multiplexer (not shown) to bypass signals from and to drivers 120 and 130 and switch fabric 110 in programming logic 100. Next, first register 222 provides the input test value to an input port of combinatorial logic 224. Using the input test value as an input, signals propagate through combinatorial logic 224, which produces an output test value. When clocked, second register 226 latches the output test value into a memory element of second register 226. In the simple case shown, combinatorial logic 224 includes a single input port and a single output port. Often, however, combinatorial logic includes multiple input ports and one or more output ports. A functional logic block that includes a discrete register for each input port and a discrete register for each output port may be tested in the manner described above.

FIG. 4B shows typical circuitry for testing multiple functional logic blocks 220A, 220B and 220B. Functional logic blocks 220A, 220B and 220B are daisy chained together with a scan-in/scan-out line by coupling an output port of one register to an input port of the next register. As shown, registers 222 and 226 are connected in one long chain. Alternatively, input registers 222 may be connected in one or more chains separate from output registers 226, which may also be connected in one or more separate chains.

Each functional logic block 220A, 220B and 220B includes a first register 222, combinatorial logic 224 and a second register 226. Input ports to each input register 222 are connected to an output port of a multiplexer 221. The first data input port of multiplexer 221 is connected to a scan-in line and the second data input port of multiplexer 221 is connected to a driver 120 in programming logic 100. Input ports to each output register 226 are similarly connected to an output port of a multiplexer 225. The first data input port of multiplexer 225 is connected to combinatorial logic 224 and the second data input port of multiplexer 225 is connected to a bypass line around combinatorial logic 224. Since each input port to each register 222 and 226 is preceded with a multiplexer, the input value provided to register 222 may be switched between a normal mode signal and a test mode signal. When in the normal mode, multiplexers 221 and 225 provide signals from driver 120 and combinatorial logic 224, respectively. When in the test mode, multiplexers 221 and 225 provide signals from the scan-in line and the bypass line, respectively.

Functional logic blocks 220A, 220B and 220B may be tested with test vectors containing separate test values as follows. Each input register 222 is filled using an input test vector. The input test vector includes a value for each register 222 and 226 where the odd values are for registers 222, which each represent a value that will be presented to combinatorial logic 224, and the even values are for registers 226, which are dummy placeholder values. To write the input test vector to input registers 222, the input test vector is shifted into the daisy chain of registers 222 and 226. Next, the input value stored in each register 222 is clocked to an output port of register 222. One input value from each register 222 enters combinatorial logic 224 and one or more output values exit combinatorial logic 224. A separate register 226 latches each output value into a separate memory element of separate output register 226. Thus, each output register 226 holds a resulting output value combinatorial logic 224. An output test vector may be read out of registers 226 in a similar manner as the input test vector was written into registers 222. To read the output test vector from output registers 226, values (e.g., as data bits) are shifted out of the daisy chain of registers 222 and 226 and accumulated to form the output test vector.

For additional information on scan testing, test vectors and antifuse structures, see, e.g.: U.S. Pat. No. 5,859,543 to Kolze, titled "Programming architecture for a programmable integrated circuit employing antifuses", dated Jan. 12, 1999 and assigned to QuickLogic Corporation; U.S. Pat. No. 5,898,776 to Apland et al., titled "Security antifuse that prevents readout of some but not other information from a programmed field programmable gate array", dated Apr. 27, 1999 and assigned to QuickLogic Corporation; and U.S. Pat. No. 6,081,129 to Apland et al., titled "Field programmable gate array having testable antifuse programming architecture and method therefore", dated Jun. 27, 2000 and assigned to QuickLogic Corporation. The contents of these documents are incorporated herein by reference in their entirety.

Figure 5:
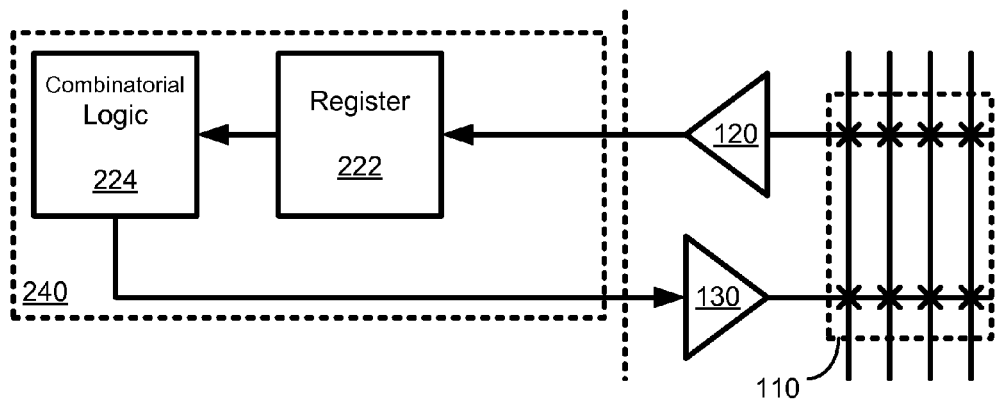
FIGS. 5, 6A and 6B show a functional logic block having an un-registered output port, in accordance with the present invention.
Figure 6A:
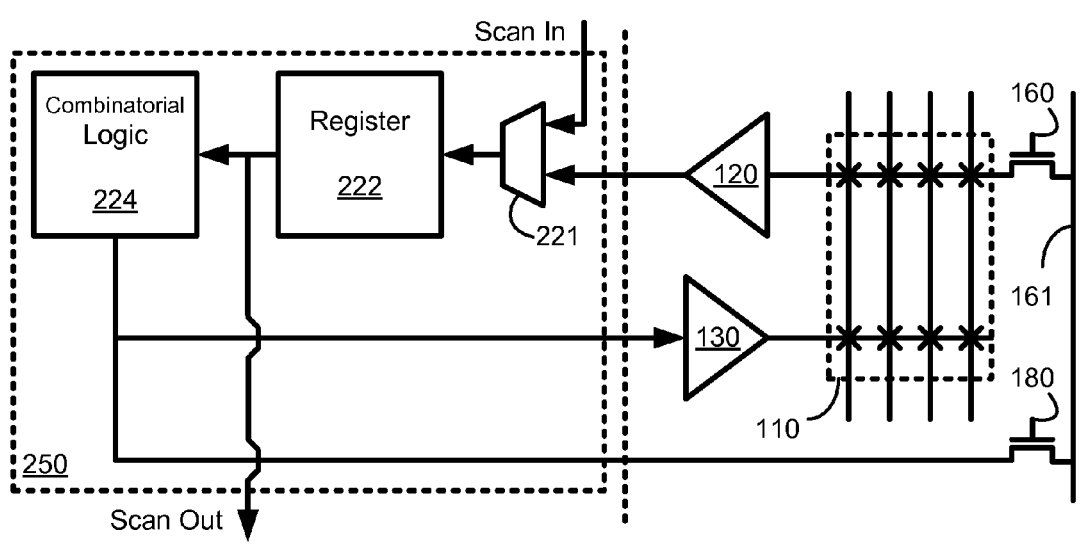
Figure 6B:
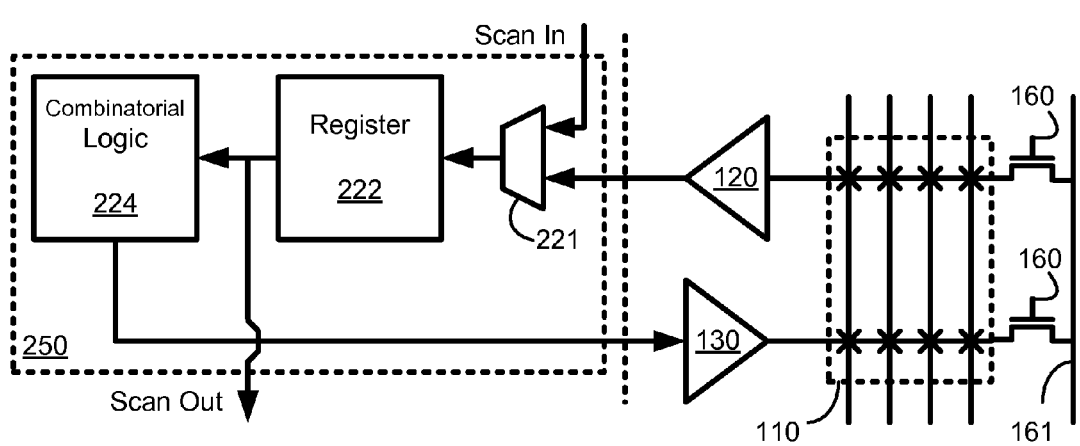

FIGS. 5, 6A and 6B show a functional logic block 240 and 250 having an un-registered signal on an output port, in accordance with the present invention.

FIG. 5 shows dedicated logic 200 having functional logic block 240 and programming logic 100 having drivers 120 and 130 as well as switch fabric 110. Unlike FIGS. 4A and 4B, which included a separate register associated with each input port and each output port of combinatorial logic 224, functional logic block 240 includes input register 222 connected to combinatorial logic 224 that no output register within functional logic block 240. Without a register at each input port and each output port of combinatorial logic 224, conventional preprogramming testing methods described above are not employed.

FIG. 6A shows dedicated logic 200 having functional logic block 250 and programming logic 100 having drivers 120 and 130, switch fabric 110, and gates 160 and 180. Again, functional logic block 250 includes input register 222 connected to combinatorial logic 224 but no output register at an output port of combinatorial logic 224. Additional testing circuitry is also shown. A multiplexer 221 has an output port connected to an input port of register 222. Multiplexer 221 also has the first input port to receive a scan-in test mode signal and a second input port to receive a normal mode signal from driver 120 in program logic 100. Multiplexer 221 also has a control port (not shown) controlling which of the two input port signals is provided to the output port of multiplexer 221. An output signal of register 222 is provided to a scan-out port of functional logic block 250. An additional gate 180 is coupled between the output port of combinatorial logic 224 and a conductor 161, which is used during programming of switch fabric 110. Conductor 161 is coupled to gates 160 which, during programming, provides a programming voltage to a row of switch fabric 110.

During testing, an input test value is fed as a signal to multiplexer 221, which provides the input test value to register 222. To feed multiplexer 221 with the input test value, a control port of multiplexer 221 is set for a test mode. When clocked, register 222 provides the input test value as an input signal to combinatorial logic 224. The resulting output test value of combinatorial logic 224 is routed through additional gate 180 to conductor 161 by activating a control port of gate 180. The output test value is then routed from conductor 161 through gate 160, by activating a control port of gate 160, to a row of switch fabric 110 and an input port of driver 120. Driver 120 then provides the output test value to register 222 through multiplexer 221. To feed multiplexer 221 with the output test value, the control port of multiplexer 221 is set for a normal mode. The output test value is then latched into a memory element of register 222 and may later be read through the scan-out port of functional logic block 250. By routing the output test value from dedicated logic 200 to programmable logic 100 through gates 180 and 160 and back to dedicated logic 200 through multiplexer 221, combinatorial logic 224 of functional logic block 250 may be tested even though combinatorial logic 224 in functional logic block 250 has an unregistered output port (i.e., an output port proving a signal not directly captured by a register, such as register 226 in FIG. 4A). In sum, to route the output test value as a signal from combinatorial logic 224 to register 222, controlled ports at gates 180 and 160 as well as a control port at multiplexer 221 are set to the allow passage of the output test value. As such, input register 222 is used to hold an output test value from combinatorial logic 224. A parallel arrangement may be used if combinatorial logic 224 provides additional unregistered output values.

FIG. 6B shows an alternative means of routing the output test value from combinatorial logic 224 to input register 222. Dedicated logic 200 includes functional logic block 250 and programming logic 100 includes drivers 120 and 130, switch fabric 110, and gates 160. The embodiment shown works has described above with reference to FIG. 6A accept in the manner of passing the output test value to conductor 161. As described above, register 222 provides an input test value to an input port of combinatorial logic 224. The resulting output test value of combinatorial logic 224 is routed through a first gate 160 to conductor 161 by activating a control port of first gate 160. First gate 160 is used during programming to configure switches 111 in switch fabric 110. During testing, however, first gate 160 is used to route the output test value to conductor 161. A second gate 160 routes the output test value to register 222 through switch fabric 110, driver 120 and multiplexer 221 as described above.

Alternatively, a common conductor 161 may be formed by joining two or more conductors as described above this reference to the FIG. 2B. For example, if first gate 160 is connected to conductor 163 and second gate 160 connected to a conductor 162, a bridge between the conductors 162 and 163 maybe formed with an additional gate 190, as shown in FIG. 2B.

Figure 7:
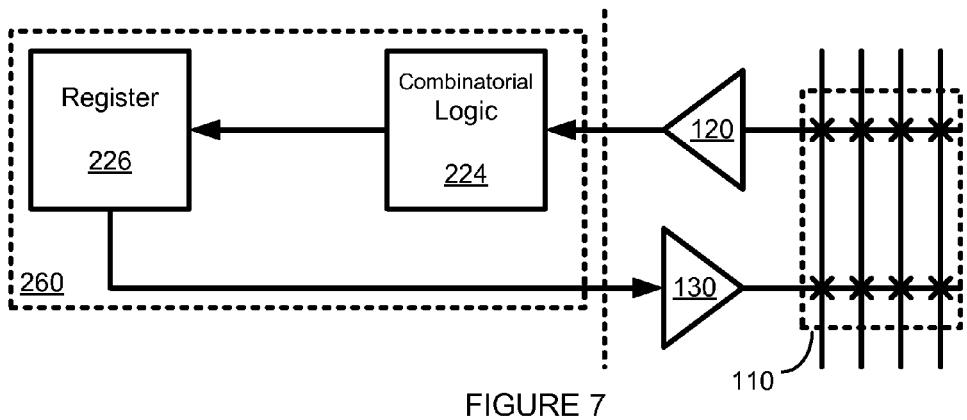
FIGS. 7, 8A and 8B show functional logic blocks having an un-registered input port, in accordance with the present invention.
Figure 8A:
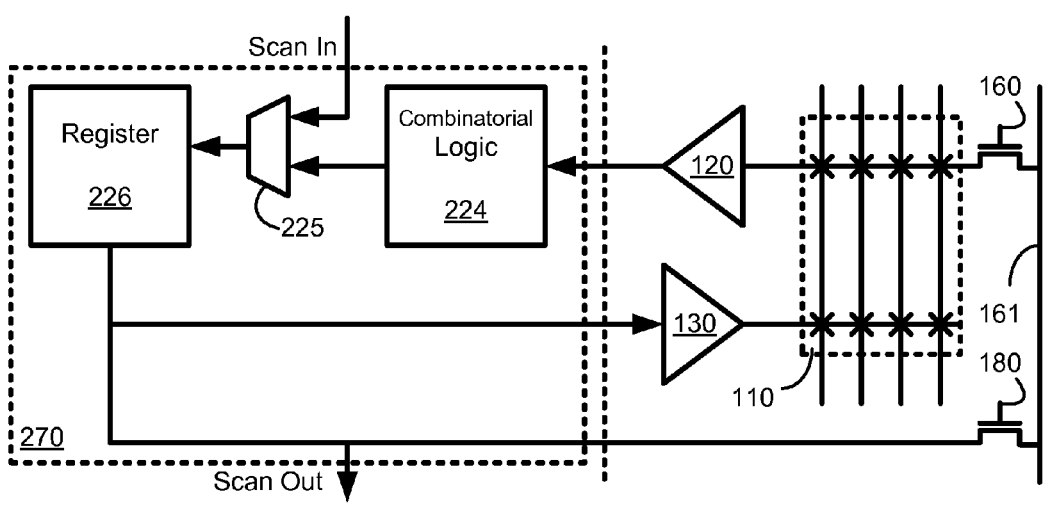
Figure 8B:
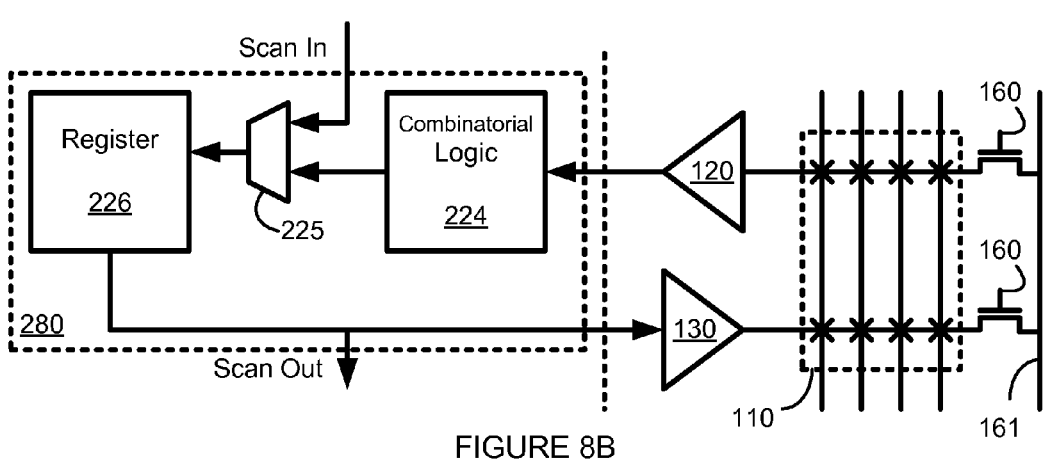

FIGS. 7, 8A and 8B show functional logic blocks 260 and 270 having an un-registered input port, in accordance with the present invention.

FIG. 7 shows dedicated logic 200 having functional logic block 260 and programming logic 100 having drivers 120 and 130 as well as switch fabric 110. Unlike FIGS. 4A and 4B and similar to FIGS. 5, 6A and 6B, functional logic block 260 is missing a register, therefore has an unregistered port associated with combinatorial logic 224. That is, functional logic block 260 includes an output register 226 connected to combinatorial logic 224 but no input register within functional logic block 260.

FIG. 8A shows dedicated logic 200 having functional logic block 270 and programming logic 100 having drivers 120 and 130, switch fabric 110, and gates 160 and 180. Additional testing circuitry is also shown. A multiplexer 225 has an output port connected to an input port of register 226. Multiplexer 225 also has the first input port to receive a scan-in signal and a second input port to receive an output signal from combinatorial logic 224. Multiplexer 225 also has a control port (not shown) controlling which of the two input port signals is provided to the output port of multiplexer 221. An output signal of register 226 is provided to a scan-out port of functional logic block 270. An additional gate 180 is coupled between the output port of the register 226 and a conductor 161, which is used during programming of switch fabric 110. Conductor 161 is coupled to gate 160 which, during programming, provides a programming voltage to a row of switch fabric 110.

During testing, an input test value is fed to multiplexer 225, which provides the input test value to register 226. To feed multiplexer 225 with the input test value, a control port of multiplexer 225 is set for a test mode. When clocked, register 226 provides the input test value at its output port. The input test value is routed through additional gate 180 to conductor 161 by activating a control port of gate 180. The input test value is then routed from conductor 161 through gate 160, by activating a control port of gate 160, to a row of switch fabric 110 and an input port of driver 120. Driver 120 then provides the input test value as an input signal to combinatorial logic 224. The resulting output test value of combinatorial logic 224 is passed to register 226 through multiplexer 225. To feed multiplexer 225 with the output test value, the control port of multiplexer 225 is set for a normal mode. The output test value is then latched into a memory element of register 226 and may later be read through the scan-out port of functional logic block 270. By routing the input test value from dedicated logic 200 to programmable logic 100 through gates 180 and 160 and back to dedicated logic 200, combinatorial logic 224 of functional logic block 250 may be tested in even though combinatorial logic 224 in functional logic block 270 has an un-registered input port (i.e., an input port proving a signal not directly held by a register, such as register 222 in FIG. 4A). In sum, to route the output test value as a signal from combinatorial logic 224 to register 226, controlled ports at gates 180 and 160 as well as a control port at multiplexer 221 are set to the allow passage of the output test value. As such, output register 226 is used to hold an input test value for combinatorial logic 224. A parallel arrangement may be used if combinatorial logic 224 receives additional un-registered input values.

FIG. 8B shows an alternative means of routing the input test value as a signal from output register 226 to combinatorial logic 224. Dedicated logic 200 includes functional logic block 280 and programming logic 100 includes drivers 120 and 130, switch fabric 110, and gates 160. The embodiment shown works has described above with reference to FIG. 8A accept in the manner of passing the input test value to conductor 161. As described above, register 226 provides an input test value. This input test value is routed as a signal through a first gate 160 to conductor 161 by activating a control port of first gate 160. A second gate 160 routes the input test value to an input port of combinatorial logic 224. The resulting output test value of combinatorial logic 224 is past through multiplexer 225 to register 226. Again, a common conductor 161 may be formed by joining two or more conductors as described above this reference to the FIG. 2B.

Figure 9:
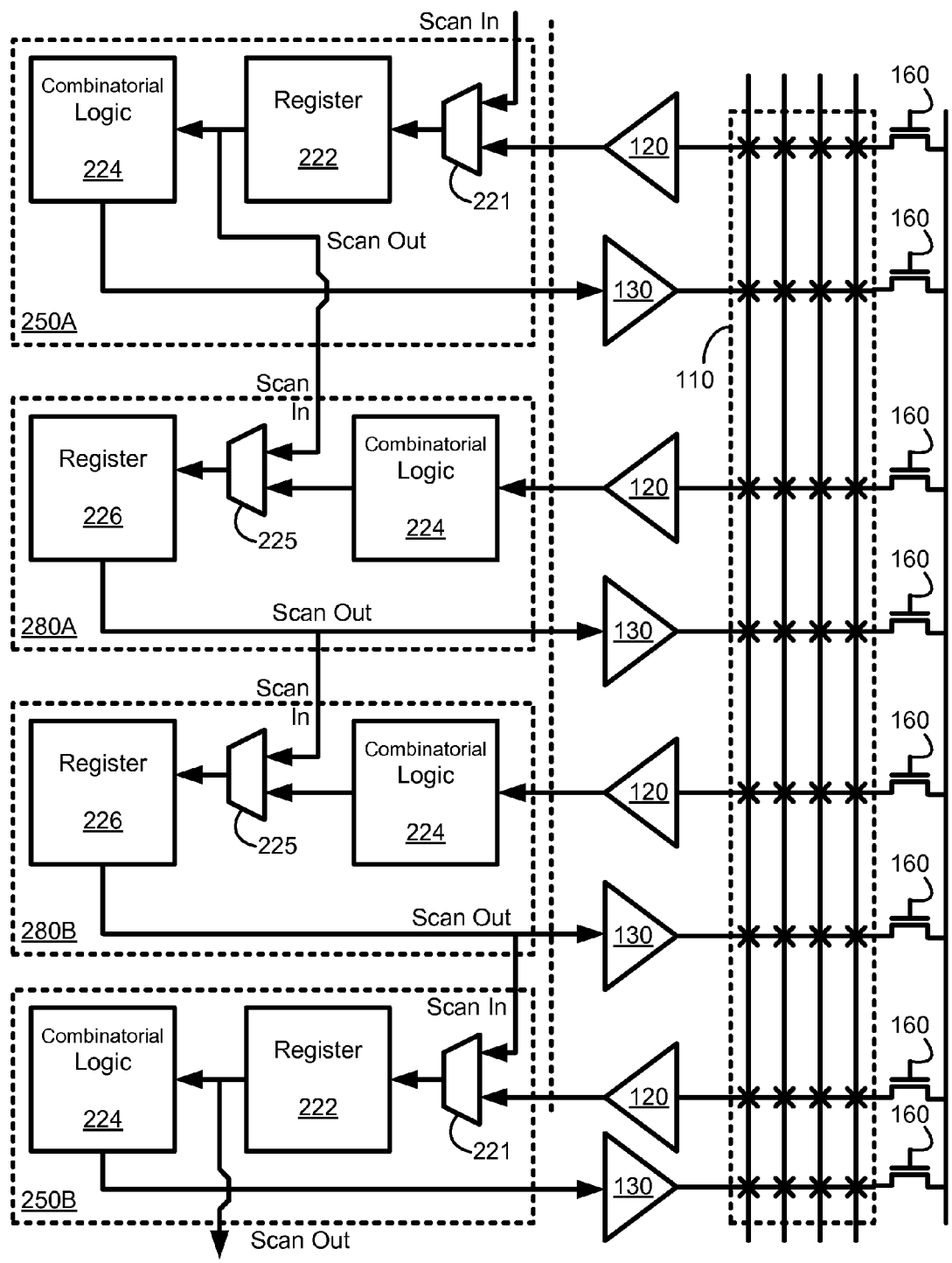
FIGS. 9, 10A and 10B show structures for testing combinatorial logic within a functional logic block having an un-registered input or output port, in accordance with the present invention.
Figure 10A:
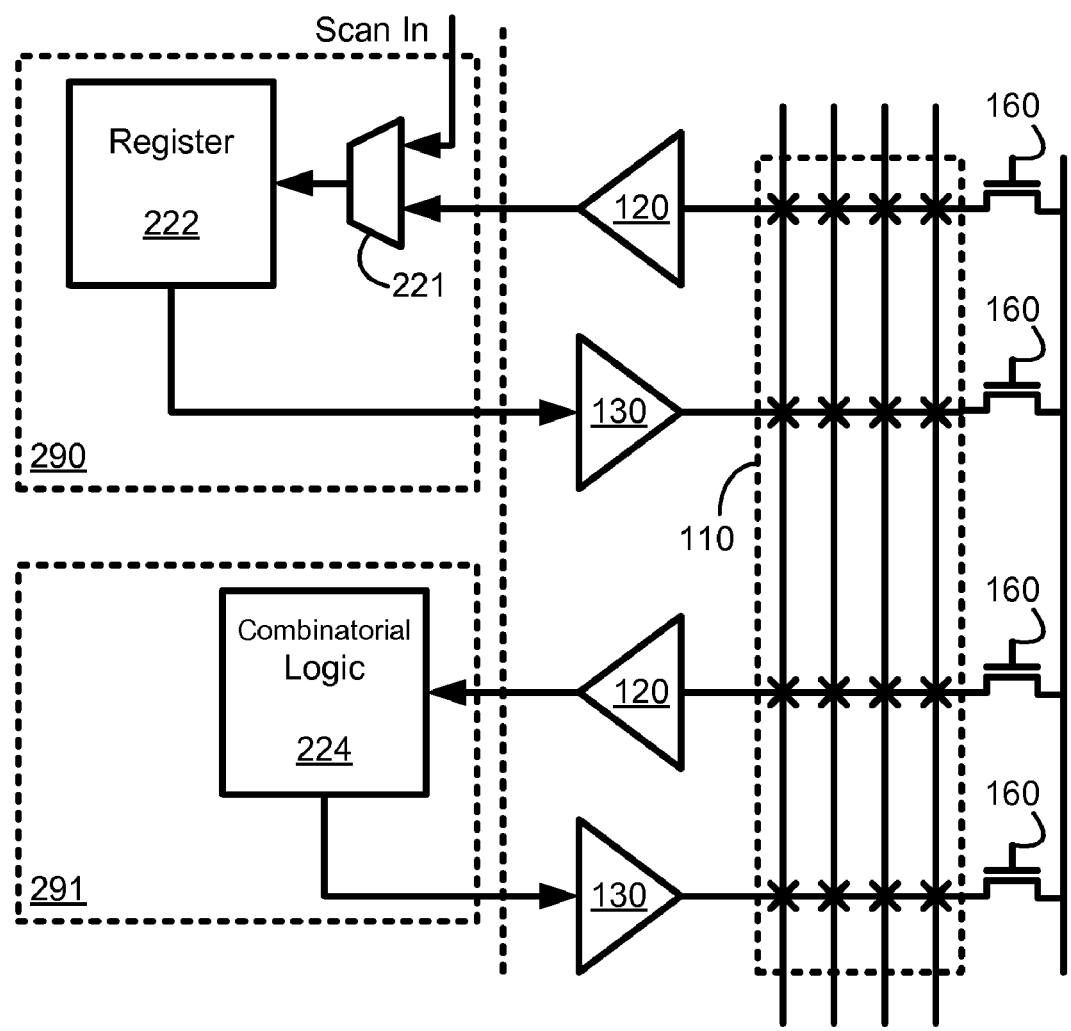
Figure 10B:
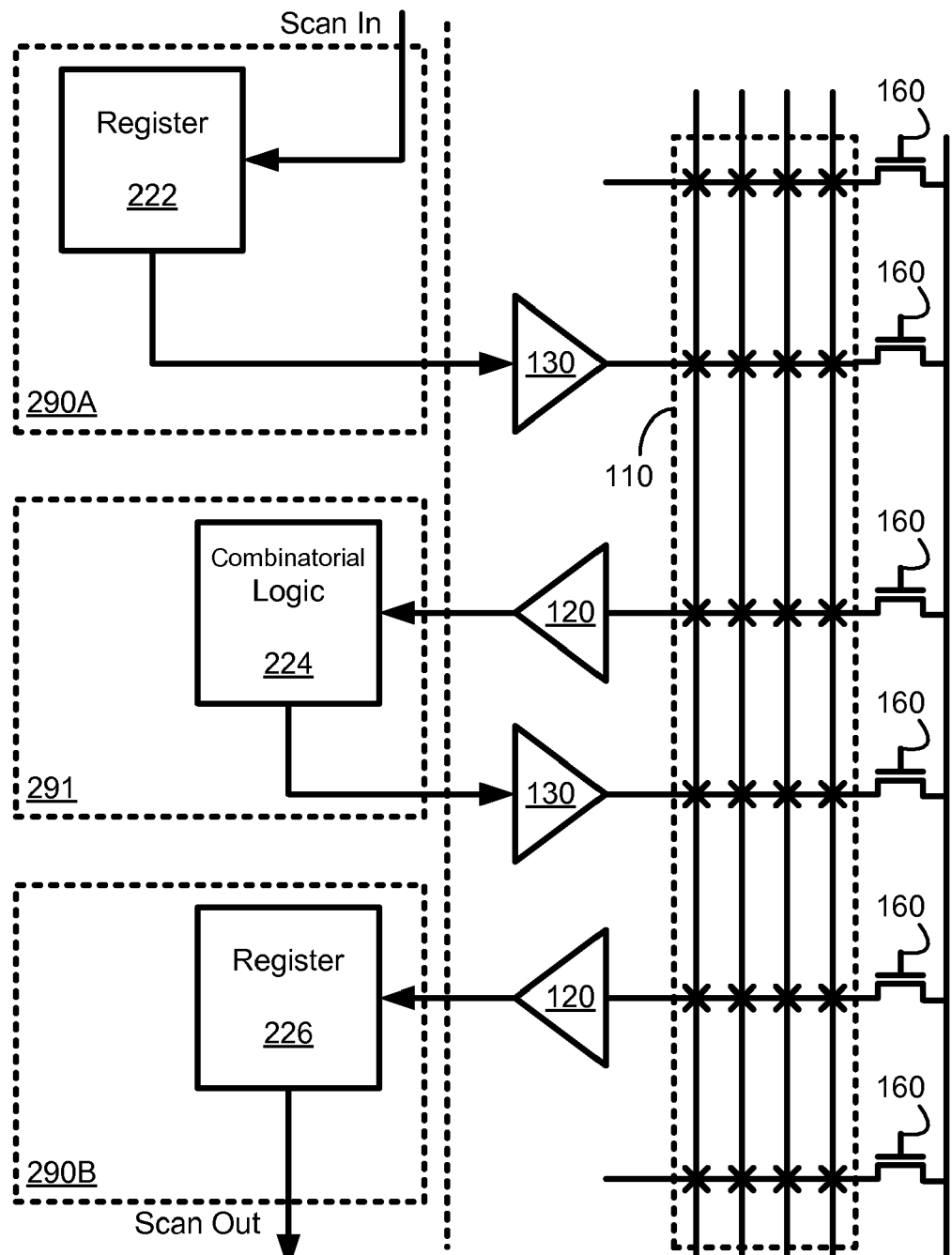

FIGS. 9, 10A and 10B show structures for testing combinatorial logic 224 within a functional logic block having an un-registered input or output port, in accordance with the present invention.

FIG. 9 shows a structure that may be used with a test vector to test the multiple functional logic blocks such as functional logic blocks 250, 270 and 280 described above. As in FIG. 4B, multiple functional logic blocks 250A, 250B, 280A and 280B each have a scan-in port and a scan-out port for each register 222 or 226. Functional logic blocks 250A, 250B, 280A and 280B are daisy chained together such that the scan-in port is supplied by the scan-out port of the preceding functional logic block. Input test vector is shifted into the daisy chained registers be a multiplexers 221 and 225. During testing, each functional logic block 250A, 250B, 280A and 280B may route the appropriate input or output test value through programming logic 100, as described above. If two separate functional logic blocks are routing test values as signals through a common conductor 161, switching the control port of unmatched gates (e.g., gates 160) may be performed sequentially as to prevent collisions on the common conductor 161. On the other hand, if two separate functional logic blocks routing test values through different conductors (e.g., conductors 162 and 163), switching the control port of the gates (e.g., gates 160) may be performed in parallel.

By routing test vectors through multiplexers 221 and 225 to registers 222 and 226, fewer shifts are the required than with the conventional case described with reference to FIG. 4B. Additionally, some test lines may be eliminated such as the bypass line around combinatorial logic 224 in FIG. 4B. Furthermore, registers do not need to be added to a design or may be removed from a design thus saving valuable silicon real estate.

A controller may be used during testing of combinatorial logic. The controller, for example gate control logic 119, may control the routing of signals through programmable logic 100 by controlling control ports of programming gates 160 and 170, additional gates 180, bridge gates 190, and multiplexers 221 and 225 throughout programming logic 100 and in the functional logic blocks in dedicated logic 200. The controller may be gate control logic 119 or alternatively, in addition to gate control logic 199 or a subset of the circuitry within gate control logic 199.

FIGS. 10A and 10B show a structure for testing combinatorial logic 224 within a first functional logic block 291 using registers 222 and/or 226 in other functional logic blocks 290, 290A and/or 290B. In FIG. 10A, register 222 in functional logic block 290 may be used to hold an input test value. During testing, the input test value is routed to a common conductor through a first gate 160 associated with driver 130 and functional logic block 290. The input test value is then routed from the common conductor through a second gate 160 associated with driver 120 and functional logic block 291. The input test value is presented to combinatorial logic 224 and a resulting output test value this routed to a common conductor through a third gate 160 associated with driver 130 and functional logic block 291. The output test value this then routed from the common conductor through a fourth gate 160 associated with driver 120 and functional logic block 290 back to register 222.

In FIG. 10B, a separate register 226 is used to hold the output test value. As described with reference to FIG. 10A, input test value is routed (from register 222 in functional logic block 290A) through a first gate 160 and a second gate 160 to combinatorial logic 224 and the resulting output test value is routed through a third gate 160 to a common conductor. The output test value may be routed to a separate register 226 in another functional logic block 290B.

For additional information on scan testing of programmable logic modules, see, e.g., U.S. Pat. No. 6,552,410 to Eaton et al., titled "Programmable antifuse interfacing a programmable logic and a dedicated device", dated Apr. 22, 2003 and assigned to QuickLogic Corporation, the contents of which are incorporated by reference in its entirety herein.

Figure 11:
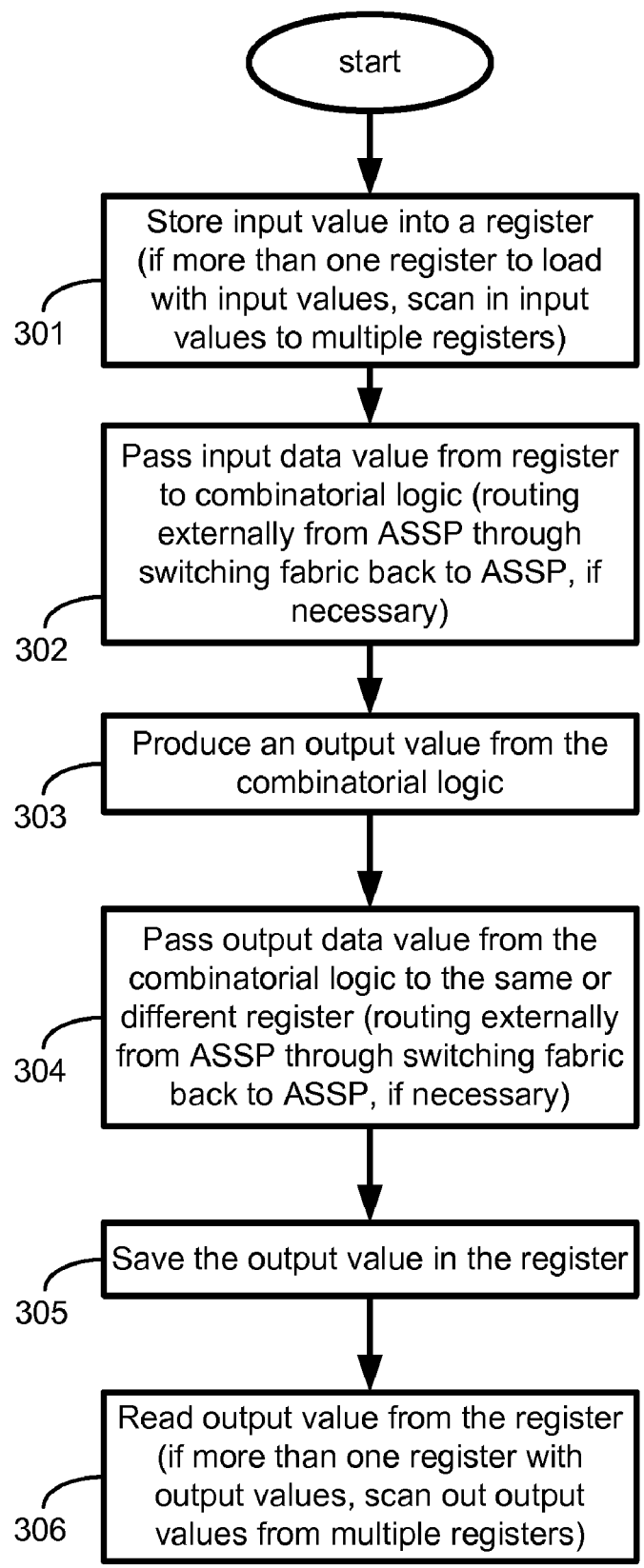
FIG. 11 describes a process of testing combinatorial logic within a functional logic block that contain at least one un-registered input or output port, in accordance with the present invention.

FIG. 11 describes a process of testing combinatorial logic 224 within a functional logic block that does not contain at least one register connected to at least one an input or output port combinatorial logic 224, in accordance with the present invention.

At 301, an input test value is stored into a memory element of a register (e.g., register 222 or 226). If more than one register is to be loaded with input test values, the input test values are scanned into memory elements of the multiple registers. At 302, the input test value is passed from the register to combinatorial logic 224. If the register holding the input test value is not positioned directly up stream from the combinatorial logic 224, the input test value may be routed externally from the functional logic block and from dedicated logic 200 to programmable logic 100 via a common conductive path, of example in the programming logic.

At 303, an output test value is produced from the combinatorial logic 224. At 304, the output test value from the combinatorial logic this past to the same or different register originally holding the input test value. Similarly, if the register to hold the output test value is not positioned directly up stream from the combinatorial logic 224, the output test value may be routed externally from the functional logic block and from dedicated logic 200 to programmable logic 100 via a common conductive path. At 305, the output test value is saved into a memory element of the register. At 306, the output test value is read from the register. If multiple registers hold output test values, a scan out procedure may be employed as described above.

The description above provides various hardware embodiments of the present invention. Furthermore, the figures provided are merely representational and may not be drawn to scale. Certain proportions thereof may be exaggerated, while others may be minimized. The figures are intended to illustrate various implementations of the invention that can be understood and appropriately carried out by those of ordinary skill in the art. Therefore, it should be understood that the invention can be practiced with modification and alteration within the spirit and scope of the claims. The description is not intended to be exhaustive or to limit the invention to the precise form disclosed. It should be understood that the invention can be practiced with modification and alteration.

What is claimed is:

1. A method for testing a functional logic block of an application-specific standard product (ASSP) in an unprogrammed programmable logic device, the method comprising:

storing an input value into a register of a functional logic block then passing the input value from the register to combinatorial logic;

producing an output value from the combinatorial logic;

passing the output value from the combinatorial logic to the register;

saving the output value in the register;

reading the output value out of the register; and testing the read output value;

wherein at least one of the input value and the output value is routed through a switch array while passing between the combinatorial logic and the register.

2. The method of testing the functional logic block of claim 1, wherein the act of storing the input value into the register comprises:

providing the input value to a first input port of a multiplexer;

switching the multiplexer between a normal mode and a test mode to provide the input value from the first input port to an output port of the multiplexer;

providing the input value from the output port of the multiplexer to an input port of the register; and clocking the input value at the input port of the register to a memory element in the register.

3. The method of testing the functional logic block of claim 1, wherein the act of passing the input value from the register to the combinatorial logic comprises:

providing the input value internally to the functional logic block as an internal signal.

4. The method of testing the functional logic block of claim 1, wherein the act of passing the input value from the register to the combinatorial logic comprises:
routing the input value through the switch array while passing from the register to the combinatorial logic.

5. The method of testing the functional logic block of claim 4, wherein the act of routing the input value through the switch array while passing from the register to the combinatorial logic comprises:
enabling a first transistor to pass the input value to a conductor; and
enabling a second transistor to pass the input value from the conductor to an input of the combinatorial logic.

6. The method of testing the functional logic block of claim 4, wherein the switch array is unprogrammed.

7. The method of testing the functional logic block of claim 4, wherein the switch array comprises an array of antifuses.

8. The method of testing the functional logic block of claim 1, wherein the act of passing the output value from the combinatorial logic to the register comprises:
providing the output value internally to the functional logic block as an internal signal.

9. The method of testing the functional logic block of claim 1, wherein the act of passing the output value from the combinatorial logic to the register further comprises:
providing the output value from the combinatorial logic to a second input port of a multiplexer;
switching the multiplexer from a test mode to a normal mode to provide the output value from the second input port to an output port of the multiplexer;
providing the output value from the output port of the multiplexer to an input port of the register; and
clocking the output value at the input port of the register to a memory element in the register.

10. The method of testing the functional logic block of claim 1, wherein the act of passing the output value from the combinatorial logic to the register comprises:
routing the output value through the switch array from the combinatorial logic to the register.

11. The method of testing the functional logic block of claim 10, wherein the act of routing the output value through the switch array from the combinatorial logic to the register comprises:
enabling a first transistor to pass the output value to a conductor; and
enabling a second transistor to pass the output value from the conductor to an input of the combinatorial logic.

12. The method of testing the functional logic block of claim 10, wherein the switch array is unprogrammed.

13. The method of testing the functional logic block of claim 10, wherein the switch array comprises an array of antifuses.

14. The method of testing the functional logic block of claim 10, wherein the act of passing the output value from the combinatorial logic to the register further comprises:
providing the output value from the combinatorial logic to a second input port of a multiplexer;
switching the multiplexer from a test mode to a normal mode to provide the output value from the second input port to an output port of the multiplexer;
providing the output value from the output port of the multiplexer to an input port of the register; and
clocking the output value at the input port of the register to a memory element in the register.

15. A method for testing a functional logic block of an application-specific standard product (ASSP) in an unprogrammed programmable logic device, the method comprising:
storing an input value into a first register of a functional logic block then passing the input value from the first register to combinatorial logic in a first functional logic block;
producing an output value from the combinatorial logic;
routing the output value from the combinatorial logic through a switch array to a second register outside the first functional logic block and in a separate functional logic block from the first register;
saving the output value in the second register;
reading the output value out of the second register; and
testing the read output value.

16. The method of claim 15, wherein the first register is within the first functional logic block.

17. The method of claim 15, wherein the first register is external to the first functional logic block and the act of passing the input value from the first register to combinatorial logic in the first functional logic block comprises routing the input value through the switch array.

18. A method for testing a functional logic block of an application-specific standard product (ASSP) in an unprogrammed programmable logic device, the method comprising:
storing an input value into a first register outside a first functional logic block, wherein the first register is part of a second functional logic block then routing the input value from the first register through a switch array to combinatorial logic within the first functional logic block;
producing an output value from the combinatorial logic;
passing the output value from the combinatorial logic to a second register;
saving the output value in the second register;
reading the output value out of the second register; and
testing the read output value.

19. The method of claim 18, wherein the second register is within the first functional logic block.

20. The method of claim 18, wherein the second register is external to the first functional logic block and the act of passing the output value from the combinatorial logic to the second register comprises routing the output value through the switch array.

21. An unprogrammed programmable logic device comprising:
a switch array comprising a plurality of columns and a plurality of rows and a plurality of switches each having a first port coupled to a respective column of the plurality of columns and a second port coupled to a respective row of the plurality of rows;
a first plurality of gates each having
a first port coupled to a corresponding one of the plurality of columns;
a second port coupled to a source of a first programming potential; and
a control port;
a second plurality of gates each having
a first port coupled to a corresponding one of the plurality of rows;
a second port coupled to a source of a second programming potential; and
a control port;
a plurality of functional logic blocks each comprising combinatorial logic;

a first register;

gate control logic coupled to each of the control ports of each of the first plurality of gates and each of the second plurality of gates, wherein the gate control logic is operable to route a signal through the switch array:

from at least one of the first register and one of the plurality of functional logic blocks; and to the combinatorial logic from at least one of the plurality of functional logic blocks.

22. The unprogrammed programmable logic device of claim 21, wherein at least one of the plurality of functional logic blocks further comprises the first register coupled to the combinatorial logic of the at least one of the plurality of functional logic blocks.

23. The unprogrammed programmable logic device of claim 21, wherein at least one of the plurality of functional logic blocks further comprises a second register coupled to the combinatorial logic of the at least one of the plurality of functional logic blocks.

24. The method of testing the functional logic block of claim 1, wherein the act of passing the input value from the register to the combinatorial logic comprises:

routing the input value through a first transistor, coupled to the register, to a conductor; and routing the input value from the conductor through a second transistor coupled to the combinatorial logic.

25. The method of testing the functional logic block of claim 1, wherein the act of passing the output value from the combinatorial logic to the register comprises:

routing the output value through a first transistor, coupled to the combinatorial logic, to a conductor; and routing the output value from the conductor through a second transistor coupled to the register.

\* \* \* \* \*